(12) United States Patent
Yasooka

(10) Patent No.: US 7,795,729 B2
(45) Date of Patent: Sep. 14, 2010

(54) TRANSCEIVER DEVICE

(75) Inventor: Kousuke Yasooka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 258 days.

(21) Appl. No.: 11/911,770

(22) PCT Filed: Feb. 15, 2007

(86) PCT No.: PCT/JP2007/052774

§ 371 (c)(1),
(2), (4) Date: Oct. 17, 2007

(87) PCT Pub. No.: WO2007/108262

PCT Pub. Date: Sep. 27, 2007

(65) Prior Publication Data

US 2008/0150129 A1   Jun. 26, 2008

(30) Foreign Application Priority Data

Mar. 22, 2006   (JP) .............................. 2006-079501

(51) Int. Cl.
*H01L 23/10* (2006.01)
*H01L 23/34* (2006.01)
(52) U.S. Cl. ...................... 257/728; 257/678; 257/725; 257/E23.193
(58) Field of Classification Search .................. 257/78, 257/E23.193, 678, 725, 728
See application file for complete search history.

(56) References Cited

U.S. PATENT DOCUMENTS

| 5,898,909 | A  | * | 4/1999 | Yoshihara et al. ............. 455/73 |
| 6,263,193 | B1 | * | 7/2001 | Iseki et al. ..................... 455/84 |
| 2002/0025794 | A1 | * | 2/2002 | Tamaki et al. ................ 455/313 |
| 2004/0155723 | A1 | * | 8/2004 | Koriyama ..................... 333/26 |
| 2005/0056925 | A1 | * | 3/2005 | Takehara et al. ............. 257/702 |
| 2005/0104792 | A1 | * | 5/2005 | Asao et al. ................... 343/767 |

FOREIGN PATENT DOCUMENTS

| JP | 2001 203290 | 7/2001 |
| JP | 2002 198852 | 7/2002 |
| JP | 2002 300006 | 10/2002 |
| JP | 2003 168901 | 6/2003 |
| JP | 2003 198204 | 7/2003 |

* cited by examiner

*Primary Examiner*—Thanh V Pham
*Assistant Examiner*—Duy T Nguyen
(74) *Attorney, Agent, or Firm*—Oblon, Spivak, McClelland, Maier & Neustadt, L.L.P.

(57) ABSTRACT

A transceiver device includes a dielectric substrate, a ring member that is welded onto the dielectric substrate thereby forming a plurality of cavities, a cover that is welded onto the ring member, and at least one semiconductor device that is arranged in each of the cavities. The ring member has at least one passage that communicates between adjacent cavities. The passage is provided at a position shifted by substantially $\lambda g/4$ or substantially $n \times \lambda g/2 + \lambda g/4$ from a center axis of the cavities. If there are two or more passages, the passages are arranged at a $\lambda g/2$ interval, and one of the passages closest to the center axis is at a position shifted by substantially $\lambda g/4$ from the center axis.

6 Claims, 8 Drawing Sheets

| L/N | l | m | n | ORDER | TE (l, m, n) |
|---|---|---|---|---|---|
| 1 | 0 | 0 | 1 | 1 | 9.1 GHz |
| 2 | 0 | 1 | 0 | 1 | 149.9 GHz |
| 3 | 1 | 0 | 0 | 1 | 44.9 GHz |
| 4 | 1 | 1 | 0 | 2 | 156.5 GHz |
| 5 | 1 | 0 | 1 | 2 | 45.8 GHz |
| 6 | 0 | 1 | 1 | 2 | 150.2 GHz |
| 7 | 0 | 0 | 2 | 2 | 18.1 GHz |
| 8 | 0 | 2 | 0 | 2 | 299.8 GHz |
| 9 | 1 | 0 | 6 | 7 | 70.5 GHz |
| 10 | 1 | 0 | 7 | 8 | 77.7 GHz |

TRANSCEIVER DEVICE

TECHNICAL FIELD

The present invention relates to a transceiver device that is used mainly in a microwave band and a millimeter-wave band.

BACKGROUND ART

A high-frequency package on which a high-frequency semiconductor device, which operates in a high frequency band such as a microwave band and a millimeter-wave band, is mounted is often housed in a cavity that is airtightly and electrically shielded with a metallic frame or the like, considering environment resistance, operational stability, corrosion resistance, and the like.

Patent Document 1 discloses a technique in which a control signal line is wired on a dielectric multilayer substrate, a metallic frame is arranged on the dielectric multilayer substrate, and a microwave integrated circuit is mounted in the metallic frame, thereby improving input/output isolation of the integrated circuit, and in which airtight sealing is enabled by welding.

Patent Document 1: Japanese Patent Application Laid-open No. 2001-203290

DISCLOSURE OF INVENTION

Problem to be Solved by the Invention

In the above conventional technique, however, a transmission cavity and a reception cavity are spatially independently structured to ensure electrical isolation. Therefore, in the conventional technique, water saturation time is short in the cavity having small volume, and it has been impossible to mount a microwave integrated circuit or the like that has low moisture resistance.

The present invention has been achieved in view of the above problems, and it is an object of the present invention to obtain a transceiver device that can mount a microwave integrated circuit having low moisture resistance while ensuring electrical isolation.

Means for Solving Problem

To solve the above problems and to achieve the above objects, the present invention provides a transceiver device includes a plurality of cavities defined by a dielectric substrate, a ring member that has a frame form having a plurality of spaces and that is connected on the dielectric substrate, and a cover member that is connected on the ring member, and semiconductor devices for transmission and reception those mounted in the cavities, wherein a ventilation hole that communicates the cavities is formed, and the ventilation hole is arranged at a position that is shifted by substantially $\lambda g/4$ from a cavity center, at a position that is shifted by substantially $n \times \lambda g/2 + \mu g/4$ (n: positive integer) from the cavity center, or at a plurality of positions at $\mu g/2$ intervals from the position that is shifted by substantially $\lambda g/4$ from the cavity center, where $\lambda g$ is a resonance wavelength according to a cavity size.

EFFECT OF THE INVENTION

According to an aspect of the present invention, a ventilation hole that communicates a plurality of cavities is formed, and the ventilation hole is arranged at a position that is shifted by substantially $\lambda g/4$ from a cavity center, at a position that is shifted by substantially $n \times \lambda g/2 + \mu g/4$ (n: positive integer) from the cavity center, or at a plurality of positions at $\lambda g/2$ intervals from the position that is shifted by substantially $\lambda g/4$ from the cavity center, where $\lambda g$ is a resonance wavelength that depends on sizes of the cavities. Therefore, it is possible to mount a microwave integrated circuit that has low moisture resistance while maintaining electrical isolation between the respective cavities.

EXPLANATIONS OF LETTERS OR NUMERALS

Figure 1:
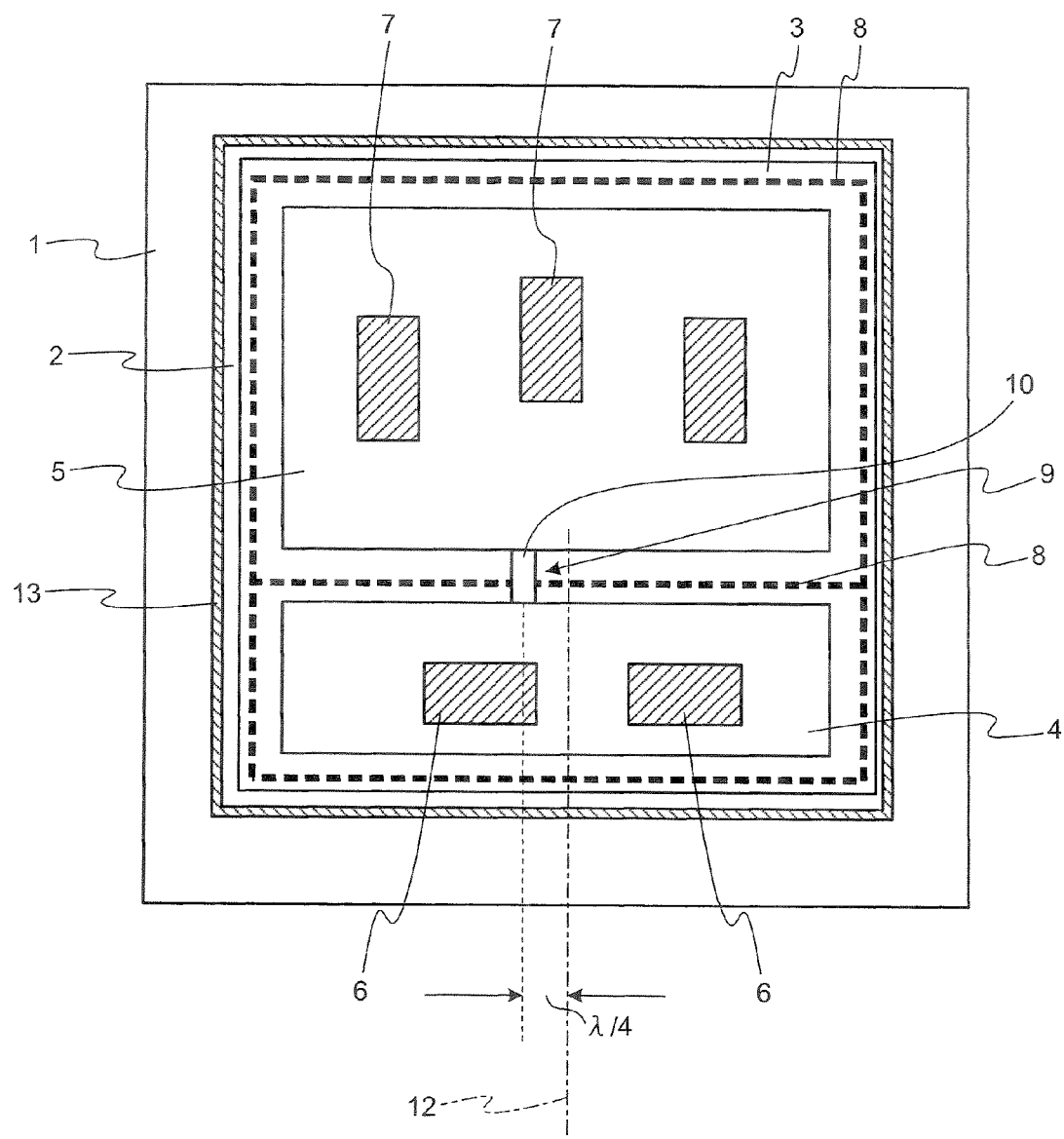
FIG. 1 is a plan view of a configuration of a transceiver device according to a first embodiment of the present invention.

1 Multilayer dielectric substrate
2 Ring member
3 Cover
4 Transmission cavity
5 Reception cavity
5a, 5b Reception cavity
8 Brazing material for welding (Welded portion)
9 Non-welded portion (Non-welded part)
10, 10a, 10b Ventilation hole
12 Cavity center
13 Brazing material

BEST MODE(S) FOR CARRYING OUT THE INVENTION

Exemplary embodiments of a transceiver device according to the present invention will be explained below in detail with reference to the accompanying drawings. Note that the present invention is not limited to the embodiments.

First Embodiment

Figure 2:
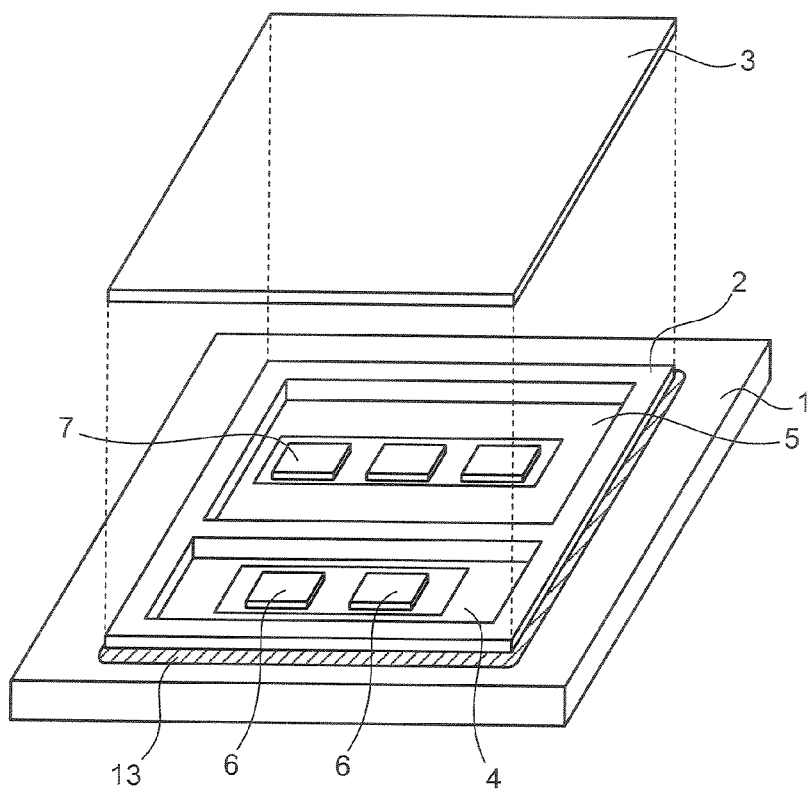
FIG. 2 is a perspective view of the configuration of the transceiver device according to the first embodiment of the present invention.

FIG. 1 is a plan view of a configuration of a transceiver device according to a first embodiment of the present invention, and FIG. 2 is a partially exploded perspective view thereof. As shown in FIGS. 1 and 2, a transceiver device according to the first embodiment includes a multilayer dielectric substrate (hereinafter, "substrate") 1, a metallic ring member (seal ring) 2, and a metallic cover member (hereinafter, "cover") 3 as a lid. A ground conductive layer is formed on a surface of the substrate 1, and the ring member 2 and the cover 3 are grounded. The ring member 2 has a rectangular shape formed with two rectangles attached to each other, thereby forming two rooms for a transmission cavity 4 and a reception cavity 5. A high-frequency semiconductor device (MMIC) for transmission or the like is mounted on the substrate 1 inside the transmission cavity 4, and an MMIC for reception or the like is mounted on the substrate 1 inside the reception cavity 5. The transmission cavity 4 is arranged in a small size that is half the size of the reception cavity 5 or less.

The substrate 1 and bottom and corner portions of the ring member 2 are fixed to each other with a brazing material (bonding material) 13 such as solder and silver solder, and an upper surface of the ring member 2 and the cover 3 are fixed to each other by welding with a brazing material (bonding material) 8 for welding. By bonding the ring member 2 and the cover 3, a plurality of MMICs 6 and 7 are airtightly sealed. Moreover, the ring member 2 and the cover 3 prevent leakage to the outside of the radiation from the MMICs 6 and 7 that are provided on the substrate 1. Namely, the ring member 2 and the cover 3 form an electromagnetic shielding member that covers a part of a surface layer of the substrate 1 and the MMICs 6 and 7.

In the first embodiment, a part of a portion sectioning between the transmission cavity 4 and the reception cavity 5 in a welded portion 8 connecting the ring member 2 and the cover 3, that is, a part of an upper surface portion of a frame of the ring member for partitioning between the transmission cavity 4 and the reception cavity 5, and a portion of the cover 3 corresponding to the part are not welded, thereby providing a non-welded portion 9. With this arrangement, a ventilation hole 10 that communicates between the transmission cavity 4 and the reception cavity 5 is provided.

Compared with the case that the ventilation hole 10 is not provided, because the transmission cavity 4 is arranged in a small size that is half the size of the reception cavity 5 or less as described above, the water saturation time of the transmission cavity 4 is short and it is impossible to mount an MMIC or the like having low moisture resistance in the transmission cavity 4. According to the first embodiment, the ventilation hole 10 enables the transmission cavity 4 and the reception cavity 5 to be regarded as a single large volume cavity being combined with the other cavity. Specifically, the ventilation hole 10 communicates air between the cavities 4 and 5, thereby virtually making the spatial volume (volume) of the transmission cavity 4 large by adding the spatial volume of the reception cavity 5 to the spatial volume (volume) of the transmission cavity 4. Accordingly, an amount of water vapor saturation of the transmission cavity 4 increases, which makes it possible to mount an MMIC having low moisture resistance even in the transmission cavity 4 that has small volume.

However, there is a problem that the electrical isolation is degraded due to, through the ventilation hole 10, leakage of electric wave of the transmission cavity 4 to the reception cavity 5, or leakage of electric wave of the reception cavity 5 to the transmission cavity 4. To solve the problem, in the first embodiment, the ventilation hole 10 is arranged at a position that is shifted by $\lambda g/4$ from a cavity center 12, thereby ensuring the electrical isolation between the transmission cavity 4 and the reception cavity 5 even if the transmission cavity 4 and the reception cavity 5 are communicated, where $\lambda g$ indicates a wavelength of resonance frequency that depends on sizes of the cavities. The size, the position, and the like of the ventilation hole 10 are described in detail later.

Although in the above example, the two cavities are different in volume, the transmission cavity 4 and the reception cavity 5 can have equivalent volume. Namely, even when the transmission cavity 4 and the reception cavity 5 are equivalent in volume, if the ventilation hole 10 is arranged at a position that is shifted by $\lambda g/4$ from the center of the cavity, an effect can be obtained that the water saturation properties of the cavities 4 and 5 is approximated as close as possible (that is, to avoid condition of one of the cavities worse than that of the other) while maintaining the electrical isolation.

Hole width L and hole height H of the ventilation hole (space) 10 are considered next. The width L of the ventilation hole 10 is set to be smaller than $\lambda g/2$ (in which $\lambda g$ is a wavelength of resonance frequency determined by a cavity size of a package used in working frequencies of MMIC, that is, a waveband of 50 to 100 gigahertz, and resonance frequency is in a 70 to 80 gigahertz band), and is suitable to be, for example, 3 $\mu g/8$ or less (for example, when the resonance frequency is in 76 to 77 gigahertz band, $\lambda g/2=2$ mm, and therefore, 3 $\mu g/8=1.5$ mm or less is suitable). In this example, in view of interference suppression (isolation) effect, manufacture variation, workability, and the like, it is preferable to set the width L of the ventilation hole 10 to about $\lambda g/4$ (for example, when the resonance frequency is 77 gigahertz, $\lambda g/2=2$ mm, and therefore, about $\lambda g/4=1$ mm is preferable). This is because a width of $\lambda g/2$ or less is required as such a width L of the ventilation hole that can cause cut-off frequency of a waveguide. However, it is preferable to suppress a passage loss as much as possible to suppress the interference between the transmission cavity 4 and the reception cavity 5, and considering a result of electromagnetic analysis, it is preferable to set to 3 $\lambda g/8$ or less in practice.

Moreover, when the hole height (space height) H of the ventilation hole 10 is 0.001 to 0.1 millimeter, the passage loss can be sufficiently suppressed. If the height H is larger than 0.1 millimeter, just the non-welded portion 9 is insufficient, and it becomes necessary to separately provide a special groove for the ventilation hole on the upper surface of the ring member 2. In this case, there is a disadvantage of decrease of productivity. If decrease of the productivity does not matter, a groove special for the ventilation hole can be separately provided on the upper surface of the ring member 2, however, the height H of the ventilation hole 10 is still required to be set to $\lambda g/2$ or less. Even though the width L of the ventilation hole 10 is about $\lambda g/4$, because the transmission cavity 4 and the reception cavity 5 are communicated, it is possible to cause the water situation time to be sufficiently longer compared to the case that the transmission cavity 4 and the reception cavity 5 are isolated. However, as the width L and the height H of the ventilation hole 10 become smaller than $\lambda g/4$, airflow through the ventilation hole gradually decreases. Therefore, the width and the height of the ventilation hole are set not to weaken the effect of averaging the water saturation amount. Incidentally, because the molecular diameter of water is 0.09572 nm×2 or smaller, width and height are required to be larger than this. When a section of the ventilation hole 10 was measured after welding the cover (lid) 3 to the ring member 2, it was confirmed that the height H was 1 µm or higher. It was confirmed that in this condition, MMIC having low moisture resistance could operate without problem under such an environment that temperature is 80° C. or higher, and humidity is 80% or higher.

Figure 3:
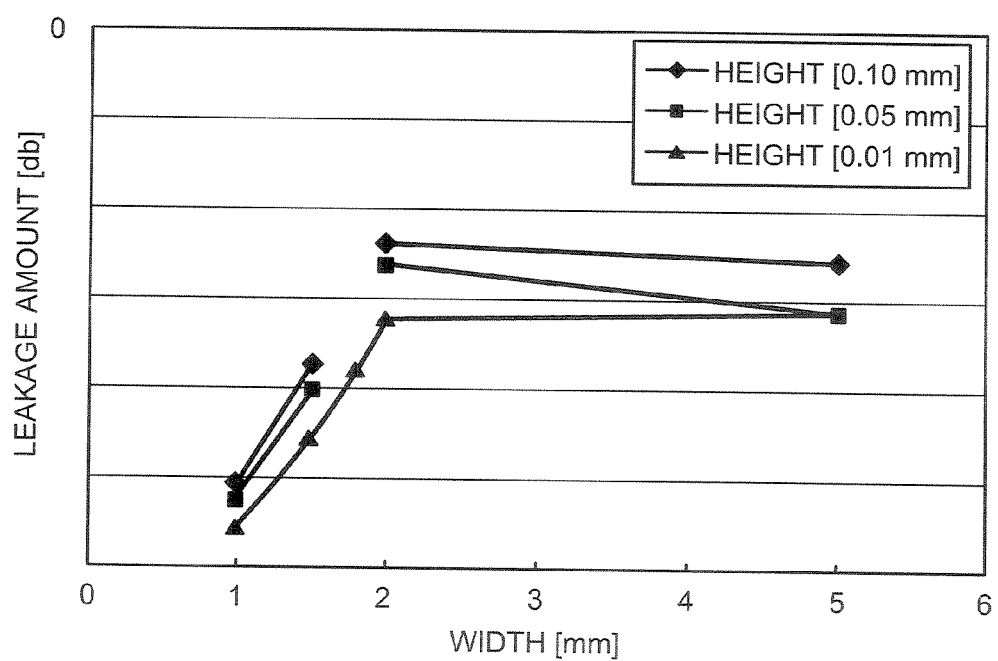
FIG. 3 is a graph showing a relation between a width of a ventilation hole and an amount of leakage.

Isolation properties of the transmission cavity 4 and the reception cavity 5 are shown in FIG. 3. The vertical axis represents a leakage amount (dB) and the horizontal axis represents the width L of the ventilation hole 10 in FIG. 3. As for the height of the ventilation hole 10, 0.01 millimeter, 0.05 millimeter, and 0.1 millimeter were used, and as for the position of the ventilation hole 10, a position that is shifted by $\lambda g/4$ from the cavity center 12 was used. As shown in FIG. 3, when the width L of the ventilation hole 10 is smaller than 2 millimeters, the leakage amount drastically decreases, and further, when the width L is 1 millimeter, the leakage amount decrease much compared to the case of 2 millimeters.

Figure 4:
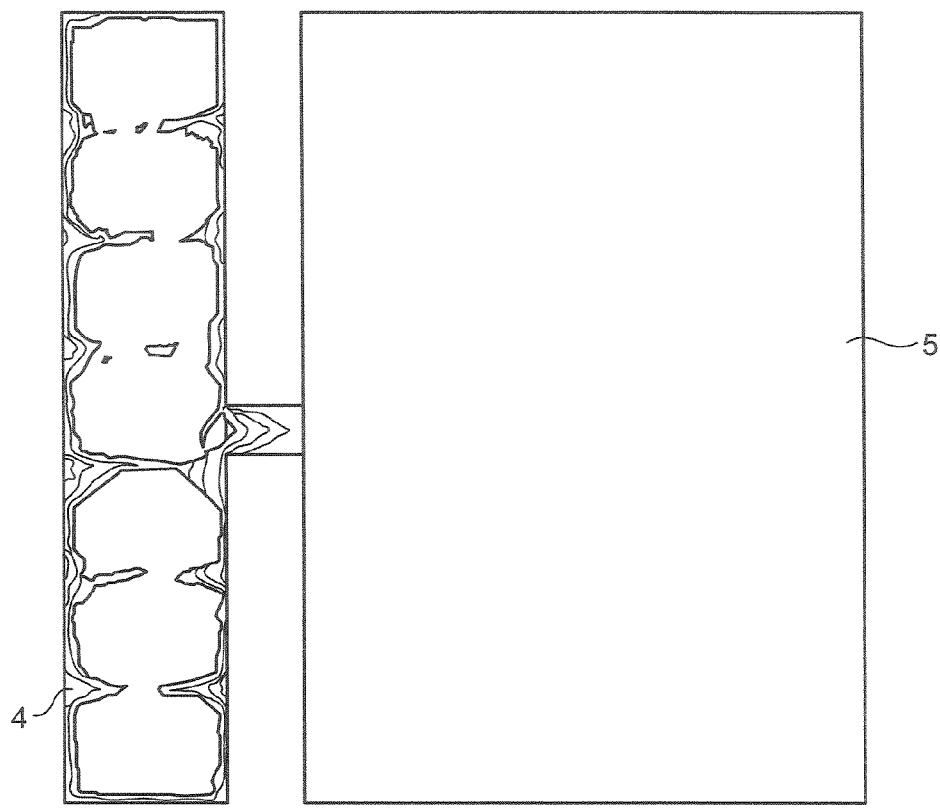
FIG. 4 depicts a resonance waveform when a transmission cavity and a reception cavity are communicated through the ventilation hole.

The position of the ventilation hole (space) is considered next. It was confirmed in electrolytic analysis that when the ventilation hole 10 is arranged at a position that is shifted by about $\lambda g/4$ (for example, when the resonance frequency is 77 gigahertz, $\lambda g/2=2$ mm, and therefore, 1 millimeter) from the cavity center 12 at a boundary between the transmission cavity 4 and the reception cavity 5, the transmission/reception isolation becomes the lowest (=the passage loss can be minimized). FIG. 4 depicts a resonance waveform when the transmission cavity 4 and the reception cavity 5 are communicated through the ventilation hole 10. In FIG. 4, a resonance mode order n=7(m+1+n=8), and a resonance waveform having seven resonance waves is seen. In this case, the electric-field peaks (antinodes) are seven. From this resonance waveform, it is found that leakage occurs at a center position of the transmission cavity 4. This indicates that amplitude corresponding to a TE10n mode (n-order mode) of the transmission cavity increases abruptly in frequency (for example, 76 to 77 gigahertz of resonance frequency) that highly influences the wavelength $\lambda g$ of the resonance frequency. Namely, it is found that an amount of leakage is large due to the band if the ventilation hole 10 is provided at the center position.

Figure 5:
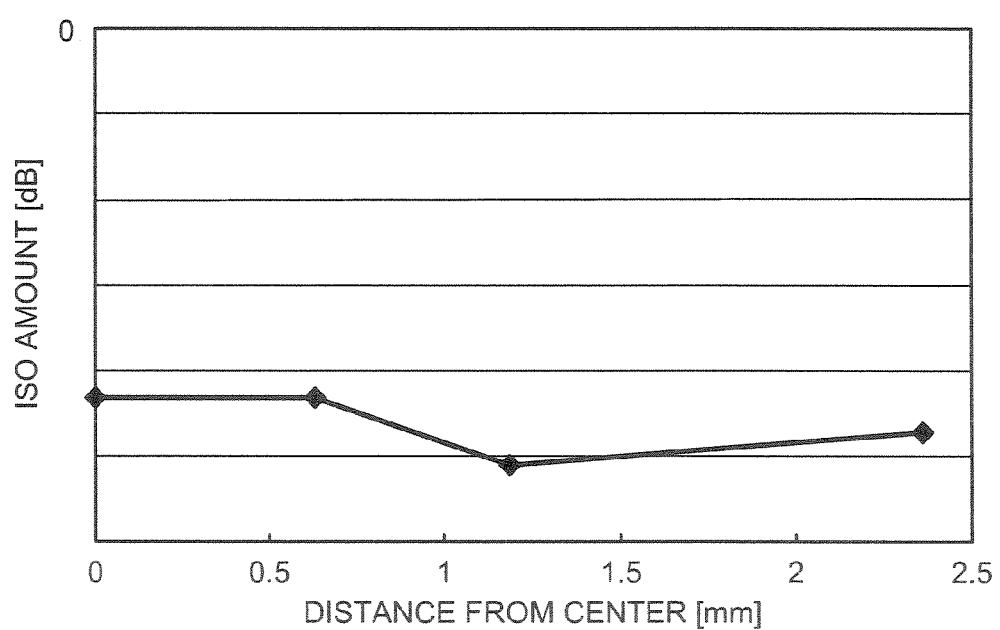
FIG. 5 is a graph showing a relation between a position of the ventilation hole and a transmission/reception isolation property when height of the ventilation hole H=0.1 mm, and width B=1 mm.
Figure 6:
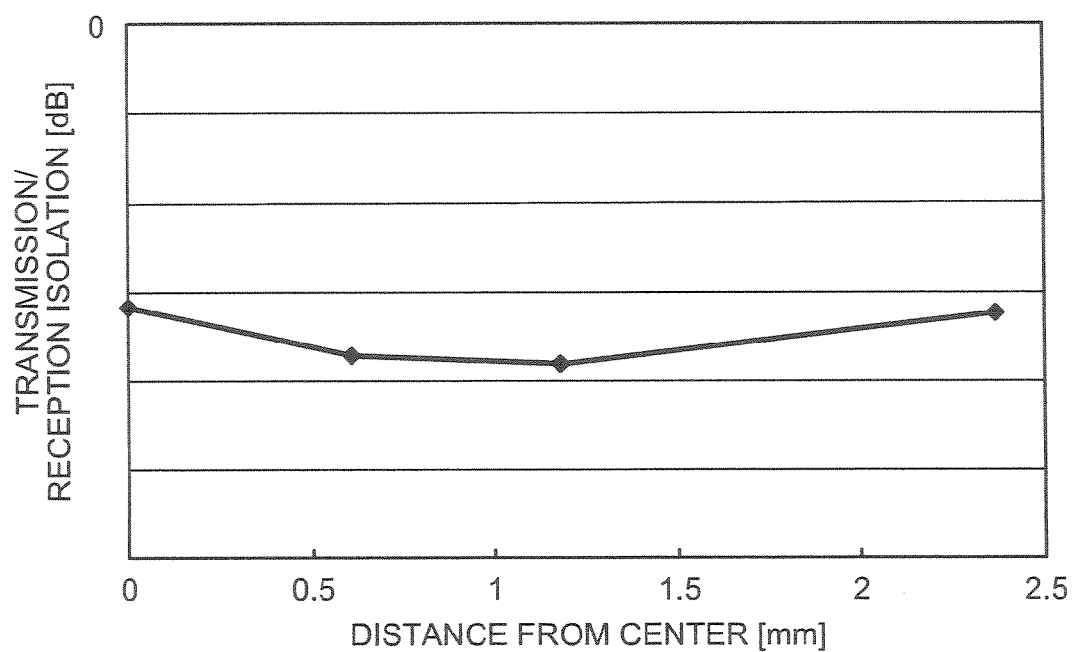
FIG. 6 is a graph showing a relation between a position of the ventilation hole and the transmission/reception isolation property when height of the ventilation hole H=0.01 mm, and width B=1.8 mm.
Figure 7:
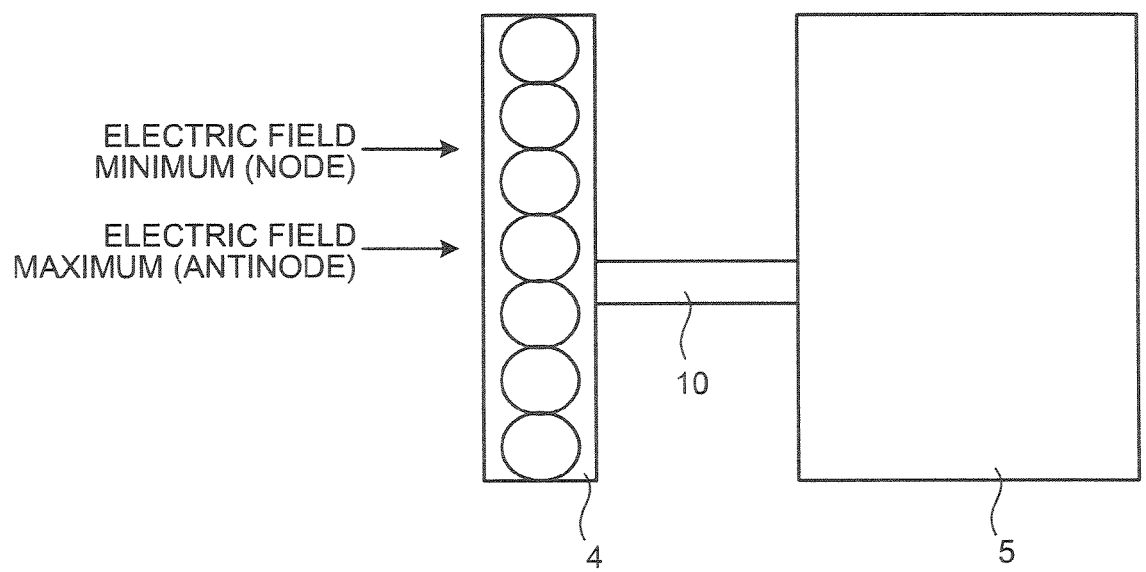
FIG. 7 exemplifies a resonance wave in the transmission cavity.

Changes in the isolation property when a shifted point D of the ventilation hole 10 indicated by a distance from the center position is changed from 0 millimeter to 2.5 millimeters are shown in FIG. 5 (a case that the height of the ventilation hole 10 H=0.1 mm and the width B=1 mm) and in FIG. 6 (a case that the height of the ventilation hole 10 H=0.01 mm and the width B=1.8 mm). The vertical axis represents the leakage amount and the horizontal axis represents the shifted position D in FIGS. 5 and 6. As shown in FIGS. 5 and 6, it is found that the leakage amount, which is maximized at the center position, scarcely changes in a range from the center position to around a point of around 1 millimeter shift, and decrease at around the point shifted by 1 millimeter from the center position. Particularly, around the point of 1 millimeter shift (corresponding to d=1.18 mm and d=$\lambda g/4$), the transmission/ reception isolation is minimized (10 dB to 20 dB lower than the leakage amount at the center position). Although, if the width B is set to 2 millimeters, a singular point at which the leakage amount temporarily becomes large appears when the shifted point D is in a range from 0 millimeter to 2 millimeters, it is found that a band having the smallest leakage amount is located at the position shifted by $\lambda g/4$ from the center in the entire band of 70 gigahertz to 80 gigahertz. This is because an n-order resonance mode that depends on a cavity length is generated, and the cavity center is located a position corresponding to the antinode of the resonance waveform. Accordingly, the leakage amount is maximized at the position of the cavity center, and the leakage amount is minimized at the position shifted by $\lambda g/4$ from the cavity center that is located corresponding to an antinode. Therefore, if the ventilation hole 10 is arranged at the position shifted by $\lambda g/4$ from the electric-field peak (antinode) (namely, the position of electric-field minimum point (node)) of the resonance wave that is generated by the cavity resonance, the leakage amount is minimized, thereby the leakage property (isolation property) is improved. FIG. 7 exemplifies the resonance waveform inside the transmission cavity.

Figures 8, 9:
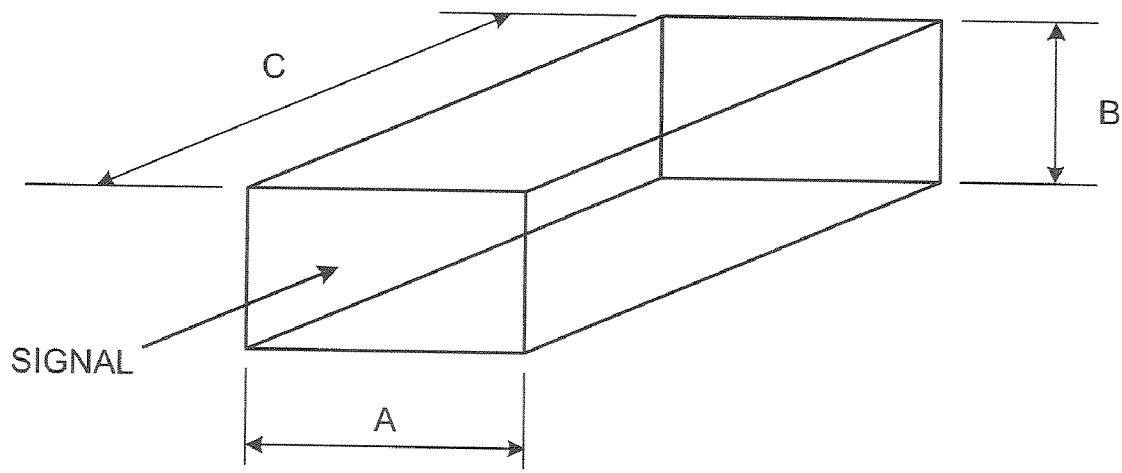
FIG. 8 depicts a calculation model of the transmission cavity.
FIG. 9 is a table of resonance frequency when a mode order in a direction of each side is appropriately set.

FIG. 8 depicts a calculation model of the transmission cavity 4, in which the length in a direction of short side of the transmission cavity 4 is denoted as A, the height is denoted as B, and the length in the direction of long side (length in a direction of signal propagation) is denoted as C. From $$\lambda 0 = C_0 \times 1000/F$$

$$\lambda 1 = C_0 \times 1000/\{F \cdot \{Er\}^{1/2}\}$$

$$\lambda g = 1/\{1-(\lambda 1/2 \cdot C)^2\}^{1/2}$$

where $C_0$: speed of light (=2.98×10$^8$ m/s), Er: relative permittivity (=1.00), and F: signal frequency (Hz), if the length C in the direction of long side is arbitrarily set to 10 to 20 millimeters and F=77 GHz, the resonance wavelength $\lambda g/2=2$ mm. According to this result, an amount $\lambda g/4$ of shift from the cavity center (antinode) to a position of node is 1 millimeter.

Furthermore, if a wavelength of an actual space is calculated as follows, the resonance wavelength $\lambda g$ can be acquired more accurately, thereby enabling to accurately set the positions of antinode and node. Equation (1) below is to calculate resonance frequency of a rectangular parallelepiped model shown in FIG. 8. When the length A of short side and the height B are set to 1 to 5 millimeters, and the length C of long side is set to 10 to 20 millimeters appropriately, a condition in which resonance occurs at frequency near 76 to 77 gigahertz is l=1, m=0, and n=7 from FIG. 9, also when equation (1) below is applied. Unique resonance frequency TE(l, m, n) when mode orders l, m, n in directions of each side are appropriately set is shown in FIG. 9

[Equation 1]

$$TE(l, m, n) = \frac{1000 C_0}{\sqrt{E_r}} \times \sqrt{\left(\frac{l}{2A}\right)^2 + \left(\frac{m}{2B}\right)^2 + \left(\frac{n}{2C}\right)^2} \quad (1)$$

where l represents a mode order in the direction of short side of the transmission cavity 4, m represents a mode order in the direction of height of the transmission cavity 4, and n represents a mode order in the direction of long side of the transmission cavity 4.

Consequently, from the number of the resonance waves in the direction of long side of the cavity (Direction C) being seven, by dividing the length C in the direction of long side of the cavity by seven, the resonance wavelength $\lambda g$ is acquired. Based on this result, to shift the position from the center (antinode) of the cavity to the position of node, the shift amount $\lambda g/4$ is set to approximately 1 millimeter (for example, $\lambda g/4=1.18$ mm).

According to the first embodiment, the ventilation hole 10 is arranged between the transmission cavity 4 and the reception cavity 5 at a position shifted by $\lambda g/4$ from the cavity center 12. Therefore, it is possible to virtually increase the volume of the transmission cavity 4 that has actually small volume while maintaining the electrical isolation between the transmission cavity 4 and the reception cavity 5, thereby increasing the water saturation amount of the transmission cavity 4. As a result, it becomes possible to mount a high-frequency semiconductor device or the like that has low moisture resistance even in the transmission cavity 4 having small volume.

Although the substrate 1 and the ring member 2 are fixed to each other with the brazing material 13 such as solder in the above example, a conductive adhesive can be used for fixing the substrate 1 with the ring member 2 instead of the brazing material 13. Moreover, although the ring member 2 and the cover 3 are fixed to each other with the brazing material 8 for welding in the above example, a conductive adhesive can be used for welding the ring member 2 to the cover 3 instead of the brazing material 8. When the conductive adhesive is used, a portion at which the conductive adhesive is not applied is provided at a position shifted by $\lambda g/4$ from the cavity center 12 on the boundary between the transmission cavity 4 and the reception cavity 5 to form the ventilation hole 10. The cavity center can be located corresponding to a node of the resonance waveform in some specific sizes of cavities. If the cavity center is located corresponding to a node, it is allowable to locate the ventilation hole 10 at the center (shifted amount from the center is 0).

Second Embodiment

Figure 10:
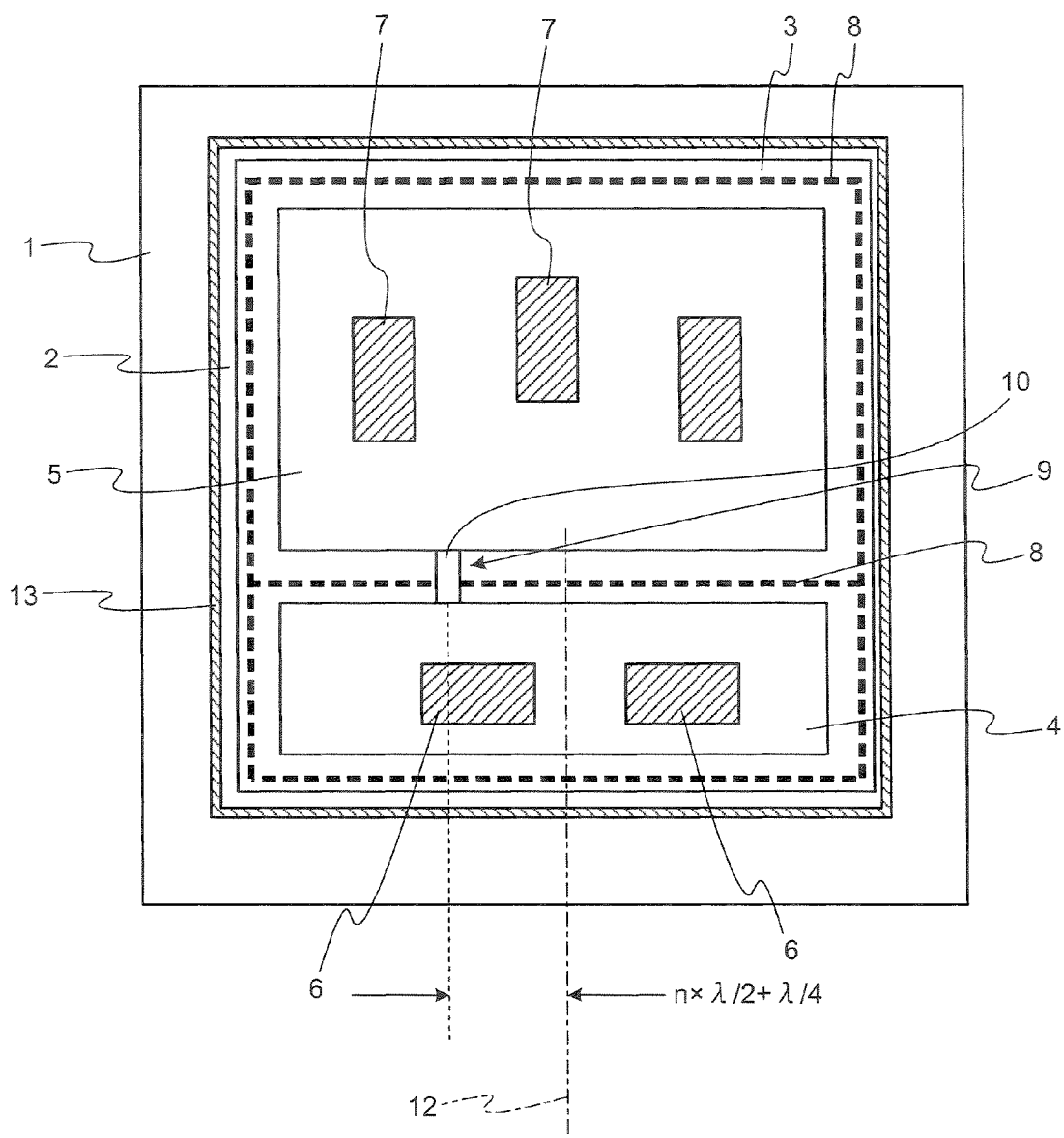
FIG. 10 is a plan view of a configuration of a transceiver device according to a second embodiment of the present invention.

FIG. 10 is a plan view of a configuration of a transceiver device according to a second embodiment of the present invention. While in the first embodiment, the ventilation hole 10 is arranged at a position shifted by $\lambda g/4$ from the cavity center 12, in the second embodiment, the ventilation hole 10 is arranged at a position shifted by $(n \times \lambda g/2)+\lambda g/4$ (n: positive integer) as shown in FIG. 10. As described above, in the resonance waveform, the electric-field peaks (antinodes) appear at $\lambda g/2$ intervals, and therefore, in the second embodiment, the ventilation hole 10 is arranged at a position shifted by $(\lambda g/4)+(\lambda g/2) \times n$ from the cavity center 12.

As described above, in the second embodiment, the ventilation hole 10 is arranged at a position shifted by $(\lambda g/4)+(\lambda g/2) \times n$ from the cavity center 12 between the transmission cavity 4 and the reception cavity 5. Therefore, it is possible to virtually increase the volume of the transmission cavity 4 that actually has small volume while maintaining the electrical isolation between the transmission cavity 4 and the reception cavity 5, thereby increasing the water saturation amount of the transmission cavity 4. As a result, it becomes possible to mount a high-frequency semiconductor device or the like that has low moisture resistance even in the transmission cavity 4 having small volume.

Third Embodiment

Figure 11:
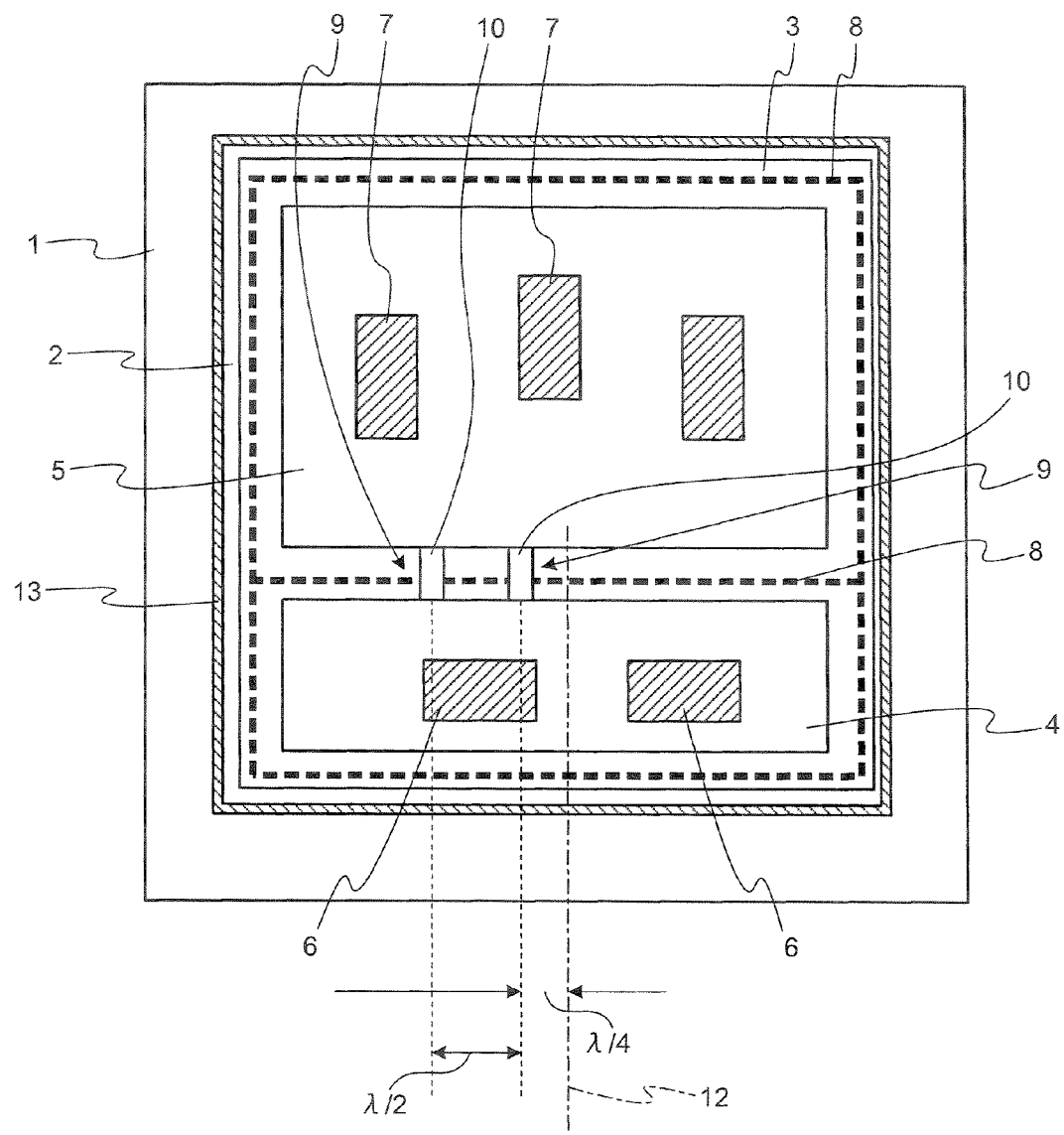
FIG. 11 is a plan view of a configuration of a transceiver device according to a third embodiment of the present invention.

FIG. 11 is a plan view of a configuration of a transceiver device according to a third embodiment of the present invention. The ventilation hole 10 is arranged only at a single position that is shifted by $\lambda g/4$ from the cavity center 12 in the first embodiment, and the ventilation hole 10 is arranged at a single position that is shifted by $\lambda g/4$ from the cavity center 12 in the second embodiment, as shown in FIG. 11. In the present embodiment, a plurality of ventilation holes is arranged at $\lambda g/2$ intervals from the position that is shifted by $\lambda g/4$ from the cavity center.

As described above, in the third embodiment, the ventilation holes are arranged between the transmission cavity 4 and the reception cavity 5 at $\lambda g/2$ intervals from the position that is shifted by $\lambda g/4$ from the cavity center 12. Therefore, it is possible to virtually increase the volume of the transmission cavity 4 that actually has small volume while maintaining the electrical isolation between the transmission cavity 4 and the reception cavity 5, thereby increasing the water saturation amount of the transmission cavity 4. As a result, it becomes possible to mount a high-frequency semiconductor device or the like that has low moisture resistance even in the transmission cavity 4 having small volume.

Fourth Embodiment

Figure 12:
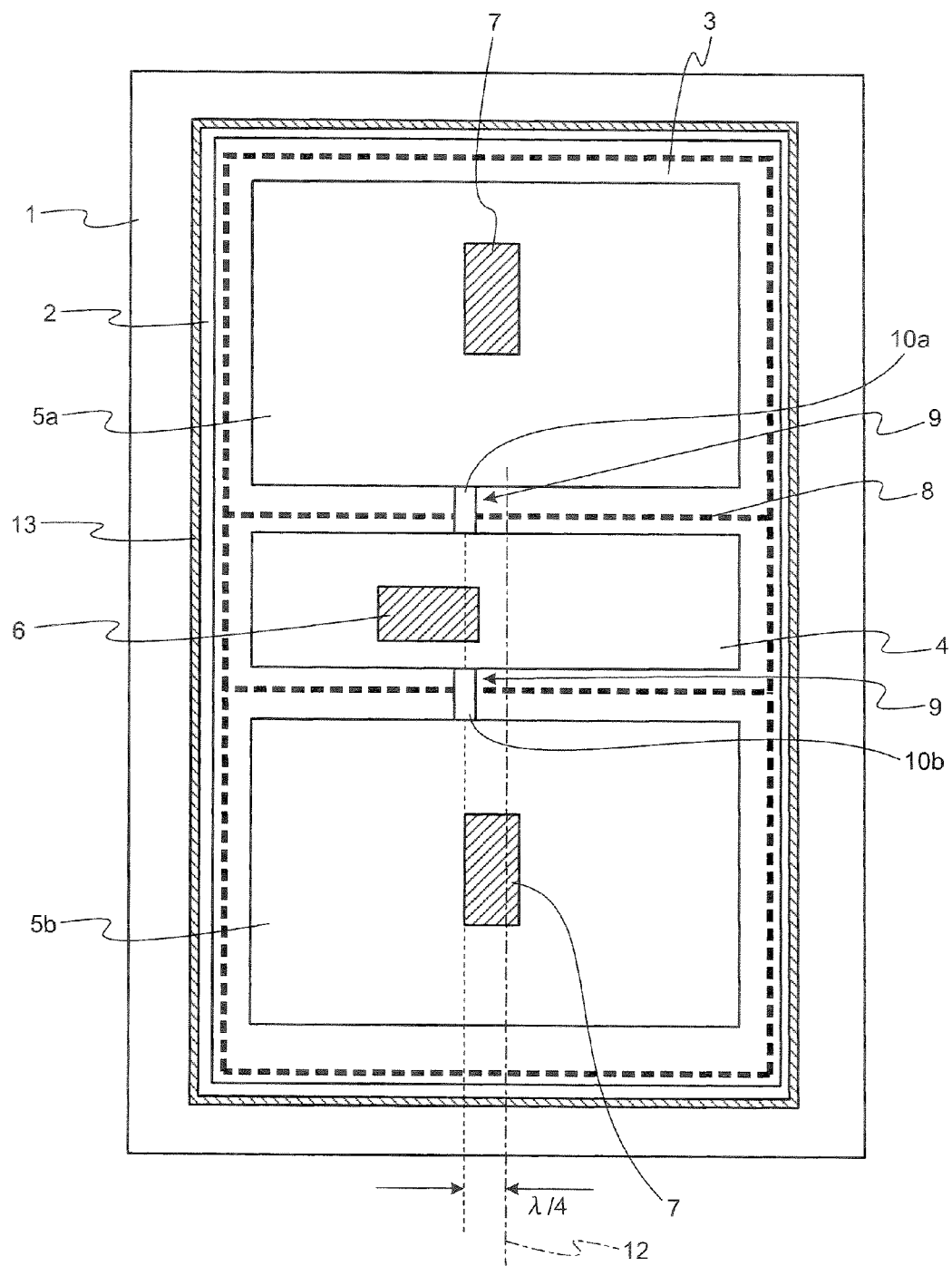
FIG. 12 is a plan view of a configuration of a transceiver device according to a fourth embodiment of the present invention.

FIG. 12 is a plan view of a configuration of a transceiver device according to a fourth embodiment of the present invention. Although it is assumed that there are two cavities for the transmission cavity 4 and the reception cavity 5 in the first to the third embodiments, it is assumed that there are three or more cavities in the fourth embodiment. In the example the one transmission cavity 4 is arranged between two reception cavities 5a and 5b. Between the transmission cavity 4 and the reception cavity 5a, a ventilation hole 10a similar to the one described above is formed, and between the transmission cavity 4 and the reception cavity 5b, a ventilation hole 10b similar to the one described above is formed. The ventilation holes 10a and 10b are arranged at positions shifted by $\lambda g/4$ from the cavity center 12, similarly to the first embodiment.

As described above, in the fourth embodiment, each of ventilation holes 10a and 10b are arranged at a position shifted by $\lambda g/4$ from the cavity center 12 between three or more cavities. Therefore, it is possible to virtually increase the volume of a cavity that actually has small volume while maintaining the electrical isolation between the respective cavities, thereby increasing the water saturation amount of the cavity that has small volume. As a result, it becomes possible to mount a high-frequency semiconductor device or the like that has low moisture resistance even in the cavity having small volume.

INDUSTRIAL APPLICABILITY

As set forth hereinabove, a transceiver device according to the present invention is suitable as a transceiver device that is used in microwave band and millimeter-wave band.

The invention claimed is:

1. A transceiver device comprising:
a dielectric substrate;
a ring member connected onto the dielectric substrate thereby forming a plurality of cavities, the ring member having at least one ventilation hole that communicates between adjacent cavities positioned based on a resonance wavelength that depends on sizes of the cavities so as to ensure electric wave isolation between the cavities;
a cover connected onto the ring member, wherein, when the cover is connected onto the ring member, the cavities are sealed; and
at least one semiconductor device positioned in each of the cavities.

2. The transceiver device according to claim 1, wherein
the ventilation hole is provided at a position shifted by substantially $\lambda g/4$ from a center axis of the cavities, wherein
$\lambda g$ is a resonance wavelength that depends on sizes of the cavities.

3. The transceiver device according to claim 1, wherein
the ventilation hole is provided at a position shifted by substantially $n \times \lambda g/2+\lambda g/4$ from a center axis of the cavities, wherein
$\lambda g$ is a resonance wavelength that depends on sizes of the cavities and n is a positive integer.

4. The transceiver device according to claim 1, wherein
a plurality of the ventilation holes are provided at a $\lambda g/2$ interval, one of the ventilation holes closest to a center axis of the cavities is provided at a position shifted by substantially $\lambda g/4$ from the center axis, wherein
$\lambda g$ is a resonance wavelength that depends on sizes of the cavities.

5. The transceiver device according to claim 1, wherein, the ring member has a bonding layer made of a predetermined material for bonding to the cover member, and the bonding layer is not formed on a portion corresponding to the ventilation hole.

6. The transceiver device according to claim 5, wherein the predetermined material of the bonding layer is one of a brazing material for welding or a conductive adhesive.

* * * * *